(12) United States Patent
Kim et al.

(10) Patent No.: US 9,973,869 B2
(45) Date of Patent: May 15, 2018

(54) ELECTRONIC DEVICE AND NOISE CANCELING METHOD THEREOF

(71) Applicant: SAMSUNG ELECTRONICS CO., LTD., Suwon-si, Gyeonggi-do (KR)

(72) Inventors: Hojun Kim, Seongnam-si (KR); Jinhee Won, Ansan-si (KR); Daechul Jeong, Seongnam-si (KR); Sungbin Hong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/287,959

(22) Filed: Oct. 7, 2016

(65) Prior Publication Data
US 2017/0127202 A1 May 4, 2017

(30) Foreign Application Priority Data

Nov. 2, 2015 (KR) .......................... 10-2015-0153281

(51) Int. Cl.
*H04B 15/00* (2006.01)
*H04R 29/00* (2006.01)
(Continued)

(52) U.S. Cl.
CPC ............. *H04R 29/001* (2013.01); *H04B 1/18* (2013.01); *H05K 5/0017* (2013.01);
(Continued)

(58) Field of Classification Search
CPC .............. H04R 29/001; H04R 2420/05; H04R 2499/11; H04B 1/18; H05K 5/0017; H05K 5/0086; H05K 5/0247
(Continued)

(56) References Cited

U.S. PATENT DOCUMENTS 8,192,234 B2 * 6/2012 Wittenberg ............ G01D 21/02
439/620.21
8,360,801 B2 * 1/2013 Lynch .................. H01R 13/641
439/488

(Continued)

FOREIGN PATENT DOCUMENTS

KR 10-1267047 5/2013

*Primary Examiner* — William A Jerez Lora
(74) *Attorney, Agent, or Firm* — Nixon & Vanderhye P.C.

(57) ABSTRACT

An electronic device and noise canceling method thereof is provided. The electronic device may include a housing; at least one output circuit arranged inside the housing and configured to generate a first signal; an opening formed on one side of the housing; a hole connected to the opening; a receptacle arranged inside the hole, and configured to receive an external connector, and electrically connected to the at least one output circuit; at least one sensor arranged within a predetermined proximity range to at least one of the opening and the receptacle; and a control circuit electrically connected electrically to the at least one output circuit, the receptacle, and the at least one sensor, wherein the control circuit is configured to detect the external connector approaching to at least one of the opening and the receptacle using the at least one sensor, to generate a second signal upon detection of the approaching external connector, and to control the at least one output circuit to change the first signal at least partly based on the second signal.

18 Claims, 11 Drawing Sheets

(51) Int. Cl.
*H05K 5/00* (2006.01)
*H05K 5/02* (2006.01)
*H04B 1/18* (2006.01)

(52) U.S. Cl.
CPC ......... *H05K 5/0086* (2013.01); *H05K 5/0247* (2013.01); *H04R 2420/05* (2013.01); *H04R 2499/11* (2013.01)

(58) Field of Classification Search
USPC .............................................. 381/94.5, 123
See application file for complete search history.

(56) References Cited

U.S. PATENT DOCUMENTS

| | | | |
|---|---|---|---|
| 9,179,233 B2 | 11/2015 | Kang | |
| 2010/0182159 A1* | 7/2010 | Lynch | H01R 13/641 340/687 |
| 2010/0272252 A1* | 10/2010 | Johnson | H04M 1/6058 379/430 |
| 2012/0200388 A1* | 8/2012 | Miura | H03K 17/955 340/5.51 |
| 2012/0319707 A1* | 12/2012 | Stangl | G01R 27/205 324/705 |

* cited by examiner

ELECTRONIC DEVICE AND NOISE CANCELING METHOD THEREOF

CROSS-REFERENCE TO RELATED APPLICATION

This application is based on and claims priority under 35 U.S.C. § 119 to a Korean patent application filed on Nov. 2, 2015, in the Korean Intellectual Property Office and assigned Ser. No. 10-2015-0153281, the disclosure of which is incorporated by reference herein in its entirety.

TECHNICAL FIELD

The disclosure relates generally to an electronic device and a noise canceling method thereof.

BACKGROUND

With the advance of technology, electronic devices are being designed to meet user's demands in various fields. For example, recent electronic devices are equipped with various functions, such as a still and motion picture function, that go beyond the voice communication function. Recently developed electronic devices may be designed to support multimedia services (such as a music service, a movie service, and a digital broadcast service), telephony services, network-based communication services (such as a wireless Internet service, Short Messaging Service (SMS), and Multimedia Messaging Service (MMS)).

In line with the advance of electronic devices, accessory devices have become diversified in terms of quality, functionality, and type. Examples of accessory devices include earphones, headsets, auxiliary storage devices, solar charging panel device lids, and cordless charging devices.

Typically, an accessory device is connected electrically to an electronic device in such a way that an external connector connected electrically to the accessory device is inserted into a receptacle of the electronic device.

When the external connector is plugged into the receptacle of the electronic device, this may cause unwanted noise. Although there are many conventional technologies for canceling noise occurring after detection of an external connector seated in the receptacle, such technologies cannot suppress the noise occurring in the course of inserting the external connector into the receptacle.

Furthermore, in line with the recent tendency toward metal housing products, an intended electrical connection is temporarily established between the external connector and the metal housing of the electronic device in the course of inserting the external connector into the receptacle such that an electric current flows from the external connector to the inside of the electronic device via the metal housing, resulting in damage to the internal circuits or electronic components of the electronic device.

SUMMARY

The disclosure addresses the above problems and aims to provide an electronic device and noise canceling method thereof that is capable of detecting the instant of insertion of an external connector into a receptacle of the electronic device and canceling the noise occurring in the course of inserting the external connector into the receptacle of the electronic device.

Also, the disclosure aims to provide an electronic device and noise canceling method thereof that is capable of protecting the internal circuits or electronic components of the electronic device against electric current flowing when an external device is coupled with the electronic device by detecting the instant of the insertion of an external connector into the receptacle of the electronic device.

In accordance with an example aspect of the disclosure, an electronic device is provided. The electronic device includes a housing; at least one output circuit arranged inside the housing and configured to generate a first signal; an opening formed on one side of the housing; a hole connected to the opening; a receptacle arranged inside the hole, configured to receive an external connector, and electrically connected to the at least one output circuit; at least one sensor arranged within a predetermined proximity range to at least one of the opening and the receptacle; and a control circuit electrically connected electrically to the at least one output circuit, the receptacle, and the at least one sensor, wherein the control circuit is configured to detect the external connector approaching at least one of the opening and the receptacle using the at least one sensor, to generate a second signal upon detection of the approaching external connector, and to control the at least one output circuit to change the first signal at least partly based on the second signal.

In accordance with another example aspect of the disclosure, an electronic device is provided. The electronic device includes a housing, at least one output circuit arranged inside the housing and configured to generate a first signal, an opening formed on one side the housing, a hole connected to the opening and configured to receive an external connector or an external accessory, at least one sensor arranged within a predetermined proximity range to at least one of the opening and the hole, and a control circuit electrically connected to the at least one output circuit and the at least one sensor, wherein the control circuit is configured to detect the external connector approaching at least one of the opening and the hole using the at least one sensor, to generate a second signal upon detection of the approaching external connector, and to control the output circuit to change the first signal at least partly based on the second signal.

In accordance with still another example aspect of the disclosure, a noise canceling method of an electronic device is provided. The noise canceling method includes detecting an external connector approaching at least one of an opening and a receptacle, generating a second signal upon detection of the approaching external connector, and changing a first signal at least partly based on the second signal.

BRIEF DESCRIPTION OF THE DRAWINGS

The above and other aspects of the disclosure will become more readily apparent from the following detailed description, taken in conjunction with the accompanying drawings, in which like reference numerals refer to like elements, and wherein.

DETAILED DESCRIPTION

Figure 1:
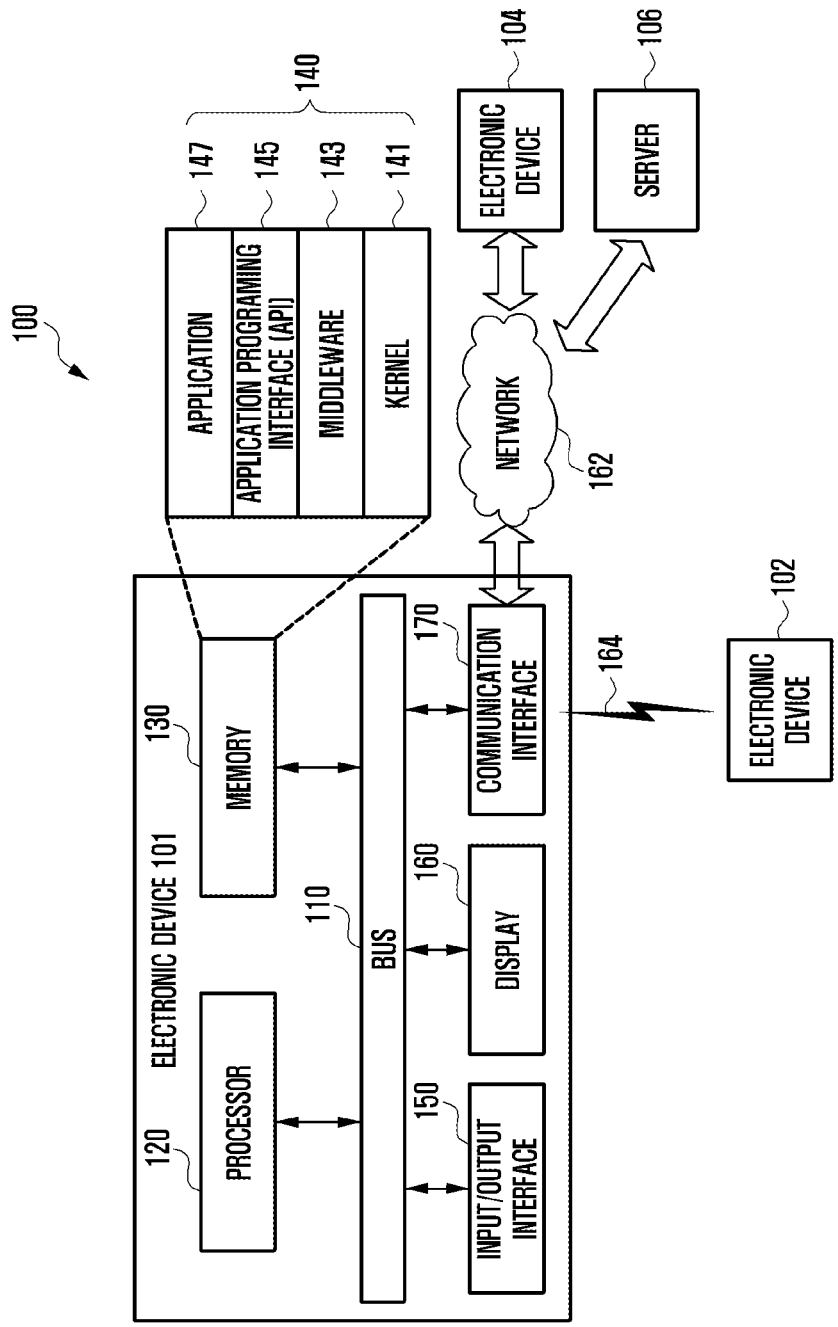
FIG. 1 is a diagram illustrating an example network structure including electronic devices according to various example embodiments.

Hereinafter, various example embodiments of the disclosure will be described with reference to the accompanying drawings. However, it should be understood that there is no intent to limit the present disclosure to the particular forms disclosed herein; rather, the present disclosure should be construed to cover various modifications, equivalents, and/or alternatives of example embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may refer, for example, to a situation in which the device, together with other devices or components, "is able to". For example, the phrase "processor adapted (or configured) to perform A, B, and C" may refer, for example, to a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

The terms used in the present disclosure are only used to describe example embodiments, and are not intended to limit the present disclosure. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

In this disclosure, an electronic device may be a device that involves a communication function. For example, an electronic device may be a smart phone, a tablet PC (Personal Computer), a mobile phone, a video phone, an e-book reader, a desktop PC, a laptop PC, a netbook computer, a PDA (Personal Digital Assistant), a PMP (Portable Multimedia Player), an MP3 player, a portable medical device, a digital camera, or a wearable device (e.g., an HMD (Head-Mounted Device) such as electronic glasses, electronic clothes, an electronic bracelet, an electronic necklace, an electronic appcessory, an electronic tattoo, a smart mirror, or a smart watch), or the like, but is not limited thereto.

According to some embodiments, an electronic device may be a smart home appliance that involves a communication function. For example, an electronic device may be a TV, a DVD (Digital Video Disk) player, audio equipment, a refrigerator, an air conditioner, a vacuum cleaner, an oven, a microwave, a washing machine, an air cleaner, a set-top box, a TV box (e.g., Samsung HomeSync™, Apple TV™, Google TV™, etc.), a game console, an electronic dictionary, an electronic key, a camcorder, or an electronic picture frame, or the like, but is not limited thereto.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.), or the like, but is not limited thereto.

According to some embodiments, an electronic device may be furniture or part of a building or construction having a communication function, an electronic board, an electronic signature receiving device, a projector, or various measuring instruments (e.g., a water meter, an electric meter, a gas meter, a wave meter, etc.), or the like, but is not limited thereto. An electronic device disclosed herein may be one of the above-mentioned devices or any combination thereof.

Hereinafter, an electronic device according to various example embodiments will be described with reference to the accompanying drawings. As used herein, the term "user" may indicate a person who uses an electronic device or a device (e.g., an artificial intelligence electronic device) that uses an electronic device FIG. 1 illustrates an example network environment including an electronic device according to various example embodiments of the present disclosure.

Referring to FIG. 1, an electronic device 101, in a network environment 100, includes a bus 110, a processor 120, a memory 130, an input/output interface (e.g., including input/output circuitry) 150, a display 160, and a communication interface (e.g., including communication circuitry) 170. According to some example embodiments, the electronic device 101 may omit at least one of the components or further include another component.

The bus 110 may be a circuit connecting the above described components and transmitting communication (e.g., a control message) between the above described components.

The processor 120 may include one or more of central processing unit (CPU), application processor (AP) or communication processor (CP). For example, the processor 120 may control at least one component of the electronic device 101 and/or execute calculation relating to communication or data processing.

The memory 130 may include volatile and/or non-volatile memory. For example, the memory 130 may store command or data relating to at least one component of the electronic device 101. According to some example embodiments, the memory may store software and/or program 140. For example, the program 140 may include a kernel 141, middleware 143, an application programming interface (API) 145, and/or an application 147 and so on. At least one portion of the kernel 141, the middleware 143 and the API 145 may be defined as operating system (OS).

The kernel 141 controls or manages system resources (e.g., the bus 110, the processor 120, or the memory 130) used for executing an operation or function implemented by the remaining other program, for example, the middleware 143, the API 145, or the application 147. Further, the kernel 141 provides an interface for accessing individual components of the electronic device 101 from the middleware 143, the API 145, or the application 147 to control or manage the components.

The middleware 143 performs a relay function of allowing the API 145 or the application 147 to communicate with the kernel 141 to exchange data. Further, in operation requests received from the application 147, the middleware 143 performs a control for the operation requests (e.g., scheduling or load balancing) by using a method of assigning a priority, by which system resources (e.g., the bus 110, the processor 120, the memory 130 and the like) of the electronic device 101 may be used, to the application 147.

The API 145 is an interface by which the application 147 may control a function provided by the kernel 141 or the middleware 142 and includes, for example, at least one interface or function (e.g., command) for a file control, a window control, image processing, or a character control.

The input/output interface 150 may be interface circuitry configured to transmit command or data inputted by a user or another external device to another component(s) of the electronic device 101. Further, the input/output interface 150 may include circuitry configured to output the command or data received from the another component(s) of the electronic device 101 to the user or the another external device.

The display 160 may include, for example, liquid crystal display (LCD), light emitting diode (LED), organic LED (OLED), or micro electro mechanical system (MEMS) display, or electronic paper display. The display 160 may display, for example, various contents (text, image, video, icon, or symbol, and so on) to a user. The display 160 may include a touch screen, and receive touch, gesture, approaching, or hovering input using a part of body of the user.

The communication interface 170 may use various communication circuitry to set communication of the electronic device 101 and external device (e.g., a first external device 102, a second external device 104, or a server 106). For example, the communication interface 170 may be connected with the network 162 through various communication circuitry, including, for example and without limitation, wireless communication or wire communication and communicate with the external device (e.g., a second external device 104 or server 106).

Wireless communication may use, as cellular communication protocol, at least one of LTE (long-term evolution), LTE-A (LTE Advance), CDMA (code division multiple access), WCDMA (wideband CDMA), UMTS (universal mobile telecommunications system), WiBro (Wireless Broadband), GSM (Global System for Mobile Communications), and the like, for example. A short-range communication 164 may include, for example, at least one of Wi-Fi, Bluetooth, Near Field Communication (NFC), Magnetic Secure Transmission or near field Magnetic data Stripe Transmission (MST), and Global Navigation Satellite System (GNSS), and the like.

An MST module is capable of generating pulses corresponding to transmission data using electromagnetic signals, so that the pulses can generate magnetic field signals. The electronic device 101 transmits the magnetic field signals to a point of sales (POS) terminal (reader). The POS terminal (reader) detects the magnetic field signal via an MST reader, transforms the detected magnetic field signal into an electrical signal, and thus restores the data.

The GNSS may include at least one of, for example, a Global Positioning System (GPS), a Global navigation satellite system (Glonass), a Beidou Navigation Satellite System (hereinafter, referred to as "Beidou"), and Galileo (European global satellite-based navigation system). Hereinafter, the "GPS" may be interchangeably used with the "GNSS" in the present disclosure. Wired communication may include, for example, at least one of USB (universal serial bus), HDMI (high definition multimedia interface), RS-232 (recommended standard-232), POTS (plain old telephone service), and the like. The network 162 may include telecommunication network, for example, at least one of a computer network (e.g., LAN or WAN), internet, and a telephone network.

Each of the first external device 102 and the second external device 104 may be same type or different type of device with the electronic device 101. According to some example embodiments, the server 106 may include one or more group of servers. According to various embodiments, at least one portion of executions executed by the electronic device may be performed by one or more electronic devices (e.g., external electronic device 102, 104, or server 106). According to some embodiments, when the electronic device 101 should perform a function or service automatically, the electronic device 101 may request performing of at least one function to the another device (e.g., external electronic device 102, 104, or server 106). For the above, cloud computing technology, distributed computing technology, or client-server computing technology may be used, for example.

Figure 2:
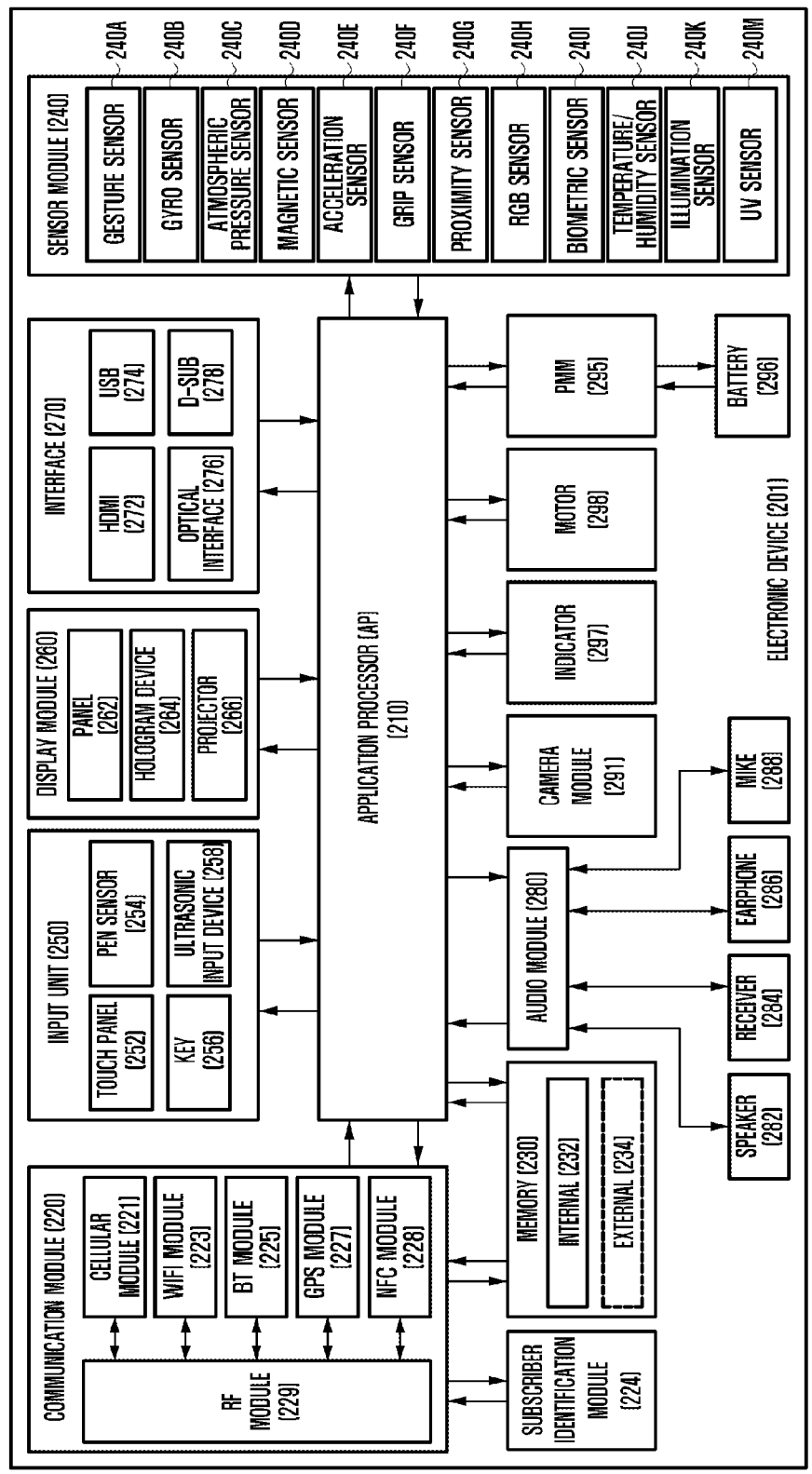
FIG. 2 is a block diagram illustrating an example configuration of an electronic device according to various example embodiments.

FIG. 2 is a block diagram illustrating an example electronic device according to an example embodiment of the present disclosure.

Referring to FIG. 2, an electronic device 201 may configure, for example, a whole or a part of the electronic device 101 illustrated in FIG. 1. The electronic device 201 includes one or more APs 210, a communication module (e.g., including communication circuitry) 220, a subscriber identification module (SIM) card 229, a memory 230, a sensor module 240, an input device (e.g., including input circuitry) 250, a display 260, an interface (e.g., including interface circuitry) 270, an audio module 280, a camera module 291, a power managing module 295, a battery 296, an indicator 297, and a motor 298.

The AP 210 operates an OS or an application program so as to control a plurality of hardware or software component elements connected to the AP 210 and execute various data processing and calculations including multimedia data. The AP 210 may be implemented by, for example, a system on chip (SoC). According to an embodiment, the processor 210 may further include a graphics processing unit (GPU) and/or image signal processor. The AP 210 may include at least one portion of components illustrated in FIG. 2 (e.g., a cellular module 221). The AP 210 may load command or data received from at least one of another component (e.g., non-volatile memory), store various data in the non-volatile memory.

The communication module 220 may include same or similar components with the communication interface 170 of FIG. 1. The communication module 220 may include various communication circuitry, such as, for, example, and without limitation, the cellular module 221, a Wi-Fi module 223, a BT module 225, a GPS module 227, a NFC module 228, and a radio frequency (RF) module 229.

The cellular module 221 provides a voice, a call, a video call, a short message service (SMS), or an internet service through a communication network (e.g., LTE, LTE-A, CDMA, WCDMA, UMTS, WiBro, GSM and the like). Further, the cellular module 221 may distinguish and authenticate electronic devices within a communication network by using a SIM (e.g., the SIM card 224). According to an embodiment, the cellular module 221 performs at least some of the functions which may be provided by the AP 210. For example, the cellular module 221 may perform at least some of the multimedia control functions. According to an embodiment, the cellular module 221 may include a CP.

Each of the Wi-Fi module 222, the BT module 223, the GPS module 224, and the NFC module 225 may include, for example, a processor for processing data transmitted/received through the corresponding module. Although the cellular module 221, the Wi-Fi module 222, the BT module 223, the GPS module 224, and the NFC module 225 are at least some (e.g., two or more) of the cellular module 221, the Wi-Fi module 222, the BT module 223, the GPS module 224, and the NFC module 225 may be included in one integrated chip (IC) or one IC package according to one embodiment. For example, at least some (e.g., the CP corresponding to the cellular module 221 and the Wi-Fi processor corresponding to the Wi-Fi module 222 of the processors corresponding to the cellular module 221, the Wi-Fi module 222, the BT module 223, the GPS module 224, and the NFC module 225 may be implemented by one SoC.

The RF module 227 transmits/receives data, for example, an RF signal. Although not illustrated, the RF module 227 may include, for example, a transceiver, a power amp module (PAM), a frequency filter, a low noise amplifier (LNA) and the like. Further, the RF module 227 may further include a component for transmitting/receiving electronic waves over a free air space in wireless communication, for example, a conductor, a conducting wire, and the like. Although the cellular module 221, the Wi-Fi module 222, the BT module 223, the GPS module 224, and the NFC module 225 share one RF module 227 in FIG. 2, at least one of the cellular module 221, the Wi-Fi module 222, the BT module 223, the GPS module 224, and the NFC module 225 may transmit/receive an RF signal through a separate RF module according to one embodiment.

The SIM card 229 is a card including a SIM and may be inserted into a slot formed in a particular portion of the electronic device. The SIM card 224 includes unique identification information (e.g., integrated circuit card identifier (ICCID)) or subscriber information (e.g., international mobile subscriber identity (IMSI)).

The memory 230 (e.g., memory 130) may include an internal memory 232 or an external memory 234. The internal memory 232 may include, for example, at least one of a volatile memory (e.g., a random access memory (RAM), a dynamic RAM (DRAM), a static RAM (SRAM), a synchronous dynamic RAM (SDRAM), and the like), and a non-volatile Memory (e.g., a read only memory (ROM), a one time programmable ROM (OTPROM), a programmable ROM (PROM), an erasable and programmable ROM (EPROM), an electrically erasable and programmable ROM (EEPROM), a mask ROM, a flash ROM, a not and (NAND) flash memory, a not or (NOR) flash memory, and the like).

According to an example embodiment, the internal memory 232 may be a solid state drive (SSD). The external memory 234 may further include a flash drive, for example, a compact flash (CF), a secure digital (SD), a micro-SD, a mini-SD, an extreme digital (xD), or a memory stick. The external memory 234 may be functionally connected to the electronic device 201 through various interfaces. According to an embodiment, the electronic device 201 may further include a storage device (or storage medium) such as a hard drive.

The sensor module 240 measures a physical quantity or detects an operation state of the electronic device 201, and converts the measured or detected information to an electronic signal. The sensor module 240 may include, for example, at least one of a gesture sensor 240A, a gyro sensor 240B, an atmospheric pressure (barometric) sensor 240C, a magnetic sensor 240D, an acceleration sensor 240E, a grip sensor 240F, a proximity sensor 240G, a color sensor 240H (e.g., red, green, and blue (RGB) sensor) 240H, a biometric sensor 240I, a temperature/humidity sensor 240J, an illumination (light) sensor 240K, and a ultraviolet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an infrared (IR) sensor, an iris sensor, a fingerprint sensor (not illustrated), and the like. The sensor module 240 may further include a control circuit for controlling one or more sensors included in the sensor module 240.

The input device 250 includes a touch panel 252, a (digital) pen sensor 254, a key 256, and an ultrasonic input device 258. For example, the touch panel 252 may recognize a touch input in at least one type of a capacitive type, a resistive type, an infrared type, and an acoustic wave type. The touch panel 252 may further include a control circuit. In the capacitive type, the touch panel 252 may recognize proximity as well as a direct touch. The touch panel 252 may further include a tactile layer. In this event, the touch panel 252 provides a tactile reaction to the user.

The (digital) pen sensor 254 may be implemented, for example, using a method identical or similar to a method of receiving a touch input of the user, or using a separate recognition sheet. The key 256 may include, for example, a physical button, an optical key, or a key pad. The ultrasonic input device 258 is a device which may detect an acoustic wave by a microphone (e.g., a microphone 288) of the electronic device 201 through an input means generating an ultrasonic signal to identify data and may perform wireless recognition. According to an embodiment, the electronic device 201 receives a user input from an external device (e.g., computer or server) connected to the electronic device 201 by using the communication module 220.

The display 260 (e.g., display 160) includes a panel 262, a hologram device 264, and a projector 266. The panel 262 may be, for example, a LCD or an active matrix OLED (AM-OLED). The panel 262 may be implemented to be, for example, flexible, transparent, or wearable. The panel 262 may be configured by the touch panel 252 and one module. The hologram device 264 shows a stereoscopic image in the air by using interference of light. The projector 266 projects light on a screen to display an image. For example, the screen may be located inside or outside the electronic device 201. According to an embodiment, the display 260 may further include a control circuit for controlling the panel 262, the hologram device 264, and the projector 266.

The interface 270 includes various interface circuitry, such as, for example, a HDMI 272, an USB 274, an optical interface 276, and a D-subminiature (D-sub) 278. The interface 270 may be included in, for example, the communication interface 170 illustrated in FIG. 1. Additionally or alternatively, the interface 270 may include, for example, a mobile high-definition link (MHL) interface, an SD card/multi-media card (MMC), or an infrared data association (IrDA) standard interface.

The audio module 280 bi-directionally converts a sound and an electronic signal. At least some components of the audio module 280 may be included in, for example, the input/output interface 150 illustrated in FIG. 1. The audio module 280 processes sound information input or output through, for example, a speaker 282, a receiver 284, an earphone 286, the microphone 288 and the like.

The camera module 291 is a device which may photograph a still image and a video. According to an embodiment, the camera module 291 may include one or more image sensors (e.g., a front sensor or a back sensor), an image signal processor (ISP) (not shown) or a flash (e.g., an LED or xenon lamp).

The power managing module 295 manages power of the electronic device 201. Although not illustrated, the power managing module 295 may include, for example, a power management integrated circuit (PMIC), a charger IC, or a battery or fuel gauge.

The PMIC may be mounted to, for example, an integrated circuit or an SoC semiconductor. A charging method may be divided into wired and wireless methods. The charger IC charges a battery and prevent over voltage or over current from flowing from a charger. According to an embodiment, the charger IC includes a charger IC for at least one of the wired charging method and the wireless charging method. The wireless charging method may include, for example, a magnetic resonance method, a magnetic induction method and an electromagnetic wave method, and additional circuits for wireless charging, for example, circuits such as a coil loop, a resonant circuit, a rectifier and the like may be added.

The battery fuel gauge measures, for example, a remaining quantity of the battery 296, or a voltage, a current, or a temperature during charging. The battery 296 may store or generate electricity and supply power to the electronic device 201 by using the stored or generated electricity. The battery 296 may include a rechargeable battery or a solar battery.

The indicator 297 shows particular statuses of the electronic device 201 or a part (e.g., AP 210) of the electronic device 201, for example, a booting status, a message status, a charging status and the like. The motor 298 converts an electrical signal to a mechanical vibration. Although not illustrated, the electronic device 201 may include a processing unit (e.g., GPU) for supporting a module TV. The processing unit for supporting the mobile TV may process, for example, media data according to a standard of digital multimedia broadcasting (DMB), digital video broadcasting (DVB), media flow and the like.

Each of the components of the electronic device according to various embodiments of the present disclosure may be implemented by one or more components and the name of the corresponding component may vary depending on a type of the electronic device. The electronic device according to various embodiments of the present disclosure may include at least one of the above described components, a few of the components may be omitted, or additional components may be further included. Also, some of the components of the electronic device according to various embodiments of the present disclosure may be combined to form a single entity, and thus may equivalently execute functions of the corresponding components before being combined.

Figure 3:
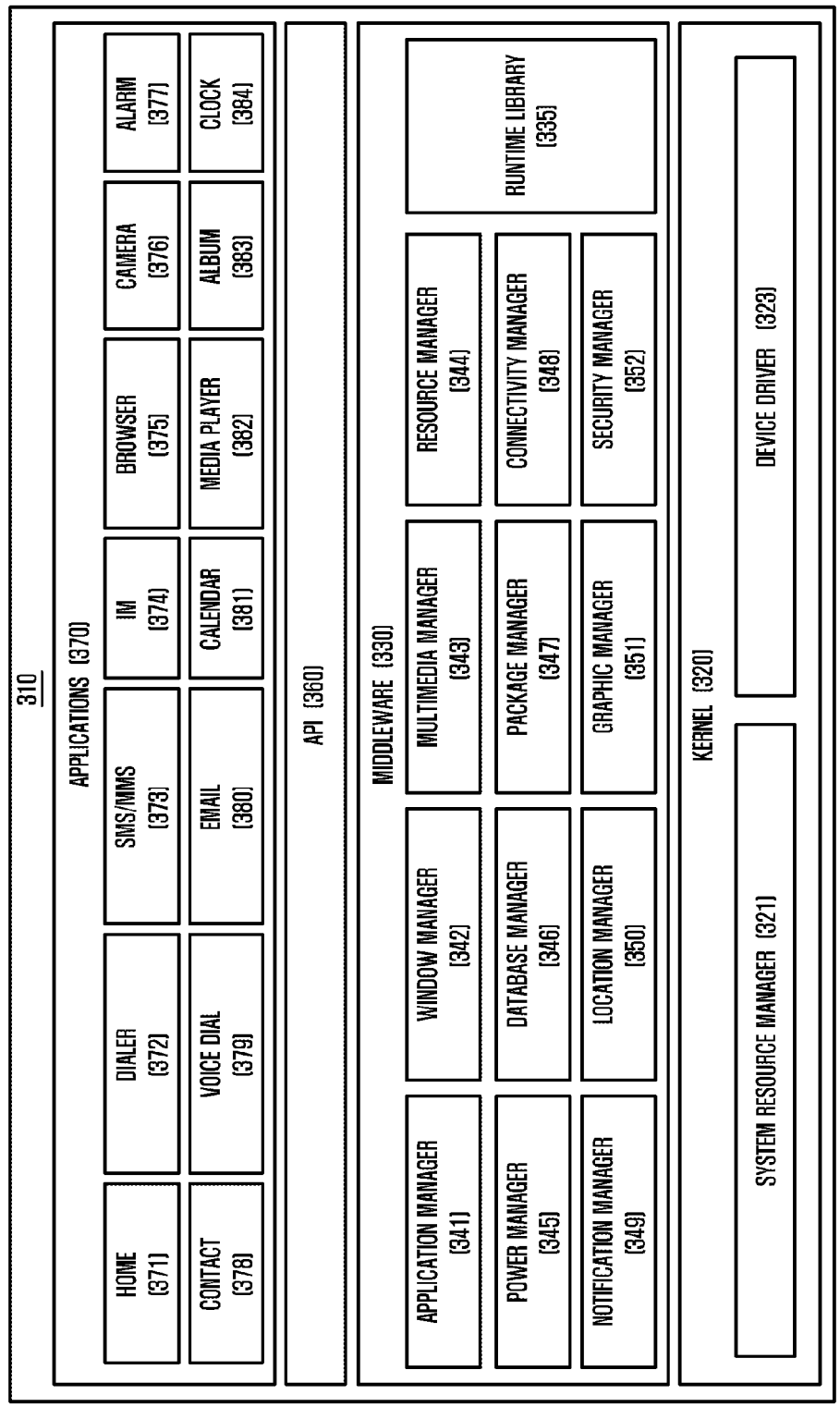
FIG. 3 is a block diagram illustrating an example configuration of a program module of an electronic device according to various example embodiments.

FIG. 3 is a block diagram illustrating an example programming module according to an example embodiment of the present disclosure.

Referring to FIG. 3, a programming module 310 may be included, e.g. stored, in the electronic apparatus 100, e.g. the memory 130, as illustrated in FIG. 1. At least a part of the programming module 310 (e.g., program 140) may be configured by software, firmware, hardware, and/or combinations of two or more thereof. The programming module 310 may include an OS that is implemented in hardware, e.g., the hardware to control resources related to an electronic device, e.g., the electronic device 101, and/or various applications. e.g., applications 370, driven on the OS. For example, the OS may be Android, iOS, Windows, Symbian, Tizen, Bada, and the like. Referring to FIG. 3, the programming module 310 may include a kernel 320, middleware 330, an API 360, and the applications 370 (e.g., application 147). At least part of the program module 310 may be preloaded on the electronic device or downloaded from a server (e.g., an electronic device 102, 104, server 106, etc.).

The kernel 320, which may be like the kernel 141, may include a system resource manager 321 and/or a device driver 323. The system resource manager 321 may include, for example, a process manager, a memory manager, and a file system manager. The system resource manager 321 may control, allocate, and/or collect system resources. The device driver 323 may include, for example, a display driver, a camera driver, a BT driver, a shared memory driver, a USB driver, a keypad driver, a Wi-Fi driver, and an audio driver. Further, according to an embodiment, the device driver 323 may include an inter-process communication (IPC) driver (not illustrated).

The middleware 330 may include a plurality of modules implemented in advance for providing functions commonly used by the applications 370. Further, the middleware 330 may provide the functions through the API 360 such that the applications 370 may efficiently use restricted system resources within the electronic apparatus. For example, as shown in FIG. 3, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352 and a payment manager (not shown).

The runtime library 335 may include a library module that a compiler uses in order to add a new function through a programming language while one of the applications 370 is being executed. According to an embodiment, the runtime library 335 may perform an input/output, memory management, and/or a function for an arithmetic function.

The application manager 341 may manage a life cycle of at least one of the applications 370. The window manager 342 may manage graphical user interface (GUI) resources used by a screen. The multimedia manager 343 may detect formats used for reproduction of various media files, and may perform encoding and/or decoding of a media file by using a codec suitable for the corresponding format. The resource manager 344 may manage resources such as a source code, a memory, and a storage space of at least one of the applications 370.

The power manager 345 may manage a battery and/or power, while operating together with a basic input/output system (BIOS), and may provide power information used for operation. The database manager 346 may manage generation, search, and/or change of a database to be used by at least one of the applications 370. The package manager 347 may manage installation and/or an update of an application distributed in a form of a package file.

For example, the connectivity manager 348 may manage wireless connectivity such as Wi-Fi or BT. The notification manager 349 may display and/or notify of an event, such as an arrival message, a promise, a proximity notification, and the like, in such a way that does not disturb a user. The location manager 350 may manage location information of an electronic apparatus. The graphic manager 351 may manage a graphic effect which will be provided to a user, and/or a user interface related to the graphic effect. The security manager 352 may provide all security functions used for system security and/or user authentication. According to an embodiment, when an electronic apparatus, e.g., the electronic apparatus 100, has a telephone call function, the middleware 330 may further include a telephony manager (not illustrated) for managing a voice and/or video communication function of the electronic apparatus. The payment manger (not shown) is capable of relaying payment information from the application 370 to an application 370 or a kernel 320. Alternatively, the payment manager (not shown) is capable of storing payment-related information received from an external device in the electronic device 200 or transmitting information stored in the electronic device 200 to an external device.

The middleware 330 may generate and use a new middleware module through various functional combinations of the aforementioned internal element modules. The middleware 330 may provide modules specialized according to types of OSs in order to provide differentiated functions. Further, the middleware 330 may dynamically remove some of the existing elements and/or add new elements. Accordingly, the middleware 330 may exclude some of the elements described in the various embodiments of the present disclosure, further include other elements, and/or substitute the elements with elements having a different name and performing a similar function.

The API 360, which may be similar to the API 133, is a set of API programming functions, and may be provided with a different configuration according to the OS. For example, in a case of Android or iOS, one API set may be provided for each of platforms, and in a case of Tizen, two or more API sets may be provided.

The applications 370, which may include an application similar to the application 147, may include, for example, a preloaded application and/or a third party application. The applications 370 may include one or more of the following: a home application 371 a dialer application 372, an SMS/multimedia messaging service (MMS) application 373, an instant messaging (IM) application 374, a browser application 375, a camera application 376, an alarm application 377, a contact application 378, a voice dial application 379, an email application 380, a calendar application 381, a media player application 382, an album application 383, a clock application 384, a payment application (not shown), a health care application (not shown) (e.g., the measurement of blood pressure, exercise intensity, etc.), an application for providing environment information (not shown) (e.g., atmospheric pressure, humidity, temperature, etc.), etc. However, the present embodiment is not limited thereto, and the applications 370 may include any other similar and/or suitable application.

According to an embodiment, the applications 370 are capable of including an application for supporting information exchange between an electronic device (e.g., electronic device 101) and an external device (e.g., electronic devices 102 and 104), which is hereafter called 'information exchange application'). The information exchange application is capable of including a notification relay application for relaying specific information to external devices or a device management application for managing external devices.

For example, the notification relay application is capable of including a function for relaying notification information, created in other applications of the electronic device (e.g., SMS/MMS application, email application, health care application, environment information application, etc.) to external devices (e.g., electronic devices 102 and 104). In addition, the notification relay application is capable of receiving notification information from external devices to provide the received information to the user.

The device management application is capable of managing (e.g., installing, removing or updating) at least one function of an external device (e.g., electronic devices 102 and 104) communicating with the electronic device. Examples of the function are a function of turning-on/off the external device or part of the external device, a function of controlling the brightness (or resolution) of the display, applications running on the external device, services provided by the external device, etc. Examples of the services are a call service, messaging service, etc.

According to an embodiment, the applications 370 are capable of including an application (e.g., a health care application of a mobile medical device, etc.) specified attributes of an external device (e.g., electronic devices 102 and 104). According to an embodiment, the applications 370 are capable of including applications received from an external device (e.g., a server 106, electronic devices 102 and 104). According to an embodiment, the applications 370 are capable of including a preloaded application or third party applications that can be downloaded from a server. It should be understood that the components of the program module 310 may be called different names according to types of operating systems.

According to various embodiments, at least part of the program module 310 can be implemented with software, firmware, hardware, or any combination of two or more of them. At least part of the program module 310 can be implemented (e.g., executed) by a processor (e.g., processor 210). At least part of the programing module 310 may include modules, programs, routines, sets of instructions or processes, etc., in order to perform one or more functions.

Figure 4:
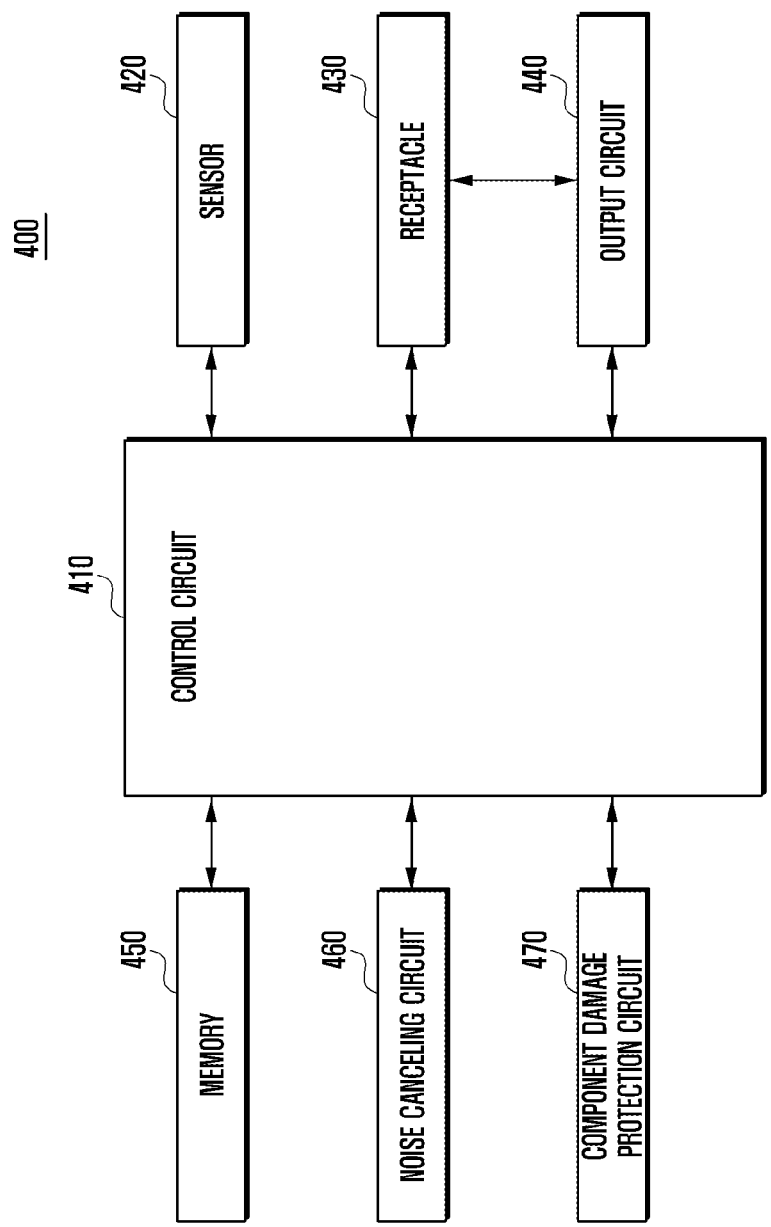
FIG. 4 is a block diagram illustrating an example configuration of an electronic device according to various example embodiments.

FIG. 4 is a block diagram illustrating an example configuration of an electronic device according to various example embodiments.

According to various example embodiments, the electronic device 400 (e.g., electronic device 201) may be a device allowing for connection of an external connector or an external accessory. Examples of the electronic device 400 may include a smartphone, a tablet personal computer (PC), a mobile phone, a video conference phone, an electronic book (e-book) reader, a desktop PC, a laptop PC, a netbook computer, a Personal Digital Assistant (PDA), a Portable Multimedia Player (PMP), an MP3 player, a mobile medical device, a camera, and a wearable device (e.g., electronic glasses, head-mounted-device (HMD), electronic clothing, electronic bracelet, electronic necklace, electronic appcessory, electronic tattoo, and smart watch), or the like, but is not limited thereto.

The electronic device 400 may include a control circuit (e.g., including a controller including processing circuitry) 410, at least one sensor 420, a receptacle 430, at least one output circuit 440, a memory 450, a noise canceling circuit 460, and a component damage protection circuit 470. According to an example embodiment, the electronic device 400 may be configured without at least one of the aforementioned components and with at least one additional component.

According to various embodiments, the receptacle 430 may be arranged inside an opening formed on one side of the electronic device and a hole connected to the opening to receive an external connector.

According to various embodiments, the electronic device 400 may include at least one conductive member arranged within a predetermined proximity range to at least one of the opening and the receptacle 430. According to an embodiment, the electronic device 400 may include at least one conductive element within a predetermined proximity range to at least one of the opening and the hole.

According to various embodiments, the control circuit 410 (e.g., processor 210) may be electrically connected to the at least one output circuit 440, the receptacle 430, and the at least one sensor 420. For example, the control circuit 410 may include circuitry (e.g., processing circuitry) configured to run an operating system or an application program to control a plurality of hardware or software components connected to the control circuit 410 and perform various data processing operations and other operations. According to an embodiment, the control circuit 410 (e.g., processor 210) may be configured to be connected electrically to the at least one output circuit 440 and the at least one sensor 420.

According to various embodiments, the sensor 420 (e.g., sensor module 240) may be arranged close to at least one of the opening and the receptacle 430. The sensor 420 may be configured to detect an approach of an external connector to the opening or the receptacle 430. According to an embodiment, the sensor 420 may be configured to detect an approach of an external connector to the opening or the hole.

According to various embodiments, the receptacle 430 may be arranged inside the hole and electrically connected to the control circuit 410 and the output circuit 440 to receive the external connector. According to an embodiment, the electronic device 400 may further include a contact or a pin inside the receptacle 430.

According to various embodiments, the output circuit 440 may be electrically connected to the receptacle 430 and the control circuit 410 in the state of being arranged inside the housing and configured to generate a first signal. The output circuit 440 may include an audio circuit configured to generate an audio output signal as the first signal or a communication circuit configured to generate a communication output signal as the first signal. According to an embodiment, the electronic device 440 may be a video circuit configured to generate a video output signal as the first signal and, in the case that the external device connected to the electronic device is an input device, the output circuit 440 may be omitted.

According to various embodiments, the memory 450 of the electronic device 400 may store the information on a predetermined range of capacitance for determining whether the external connector is compatible with the electronic device 400. According to an embodiment, the memory 450 may be configured to store, when capacitance change or connection of an external connector is detected at the receptacle 430, the displacement of the capacitance.

According to various embodiments, the electronic device 400 may include a noise canceling circuit 460. The noise canceling circuit 460 may be a circuit for controlling signals in a frequency band with noise or reducing transmit power during a data transmission period to suppress Time Division Multiple Access (TDMA) noise or a circuit for cutting off the electrical connection between the receptacle 430 and the output circuit 440 to suppress popup noise. The noise canceling circuit 460 may be omitted and, in this case, the control circuit 410 may suppress the noise by controlling the first signal of the output circuit 440 (e.g., audio circuit, video circuit, and communication circuit).

According to various embodiments, the electronic device 400 may include a component damage protection circuit 470. The control circuit 410 may check electrical connectivity between the housing of the electronic device and at least one of the electric components arranged inside the housing and activate the component damage protection circuit 470 if there is any risk of damage to the electronic components. The component damage protection circuit 470 may be a current leakage protection circuit for preventing electric current from flowing into an internal circuit or electronic components via the metal housing or an overcurrent protection circuit for protecting against an electronic current equal to or greater than a predetermined level.

According to various embodiments, the electronic device 400 may be characterized by including a housing, at least one output circuit 440 arranged inside the housing and configured to generate a first signal, an opening formed on one side of the housing, a hole connected to the opening; a receptacle 430 arranged inside the hole to receive an external connector and connected electrically to the at least one output circuit 440, at least one sensor 420 arranged close to at least one of the opening and the receptacle 430; and a control circuit 410 connected electrically to the at least one output circuit 440, the receptacle 430, and the at least one sensor 420, with the control circuit 410 being characterized by being configured to detect the approach of an external connector to at least one of the opening and receptacle 430 by means of the at least one sensor 420 to generate a second signal and to change a first signal to be output at least partly based on the second signal.

According to various embodiments, the electronic device 400 may be characterized by including at least one conductive member arranged close to at least one of the opening and the receptacle 430.

According to various embodiments, the control circuit 410 of the electronic device may be characterized by being configured to check change in capacitance between the external connector and the conductive member by means of the at least one sensor 420 and generate the second signal based thereon.

According to various embodiments, the control circuit 410 of the electronic device 400 may be characterized by being configured to decrease the strength of the first signal temporarily in response to the second signal.

According to various embodiments, the electronic device 400 may be characterized by including a contact or a pin arranged inside the receptacle 430.

According to various embodiments, the control circuit 410 of the electronic device 400 may be characterized by being configured to determine whether the external connector is seated in the receptacle 430 by means of the contact or the pin.

According to various embodiments, the control circuit 410 of the electronic device 400 may be characterized by being configured to increase the strength of the weakened first signal based on the determination result.

According to various embodiments, the control circuit 410 of the electronic device 400 may be characterized by being configured to check electrical connectivity between the housing and at least one electronic component arranged inside the housing in response to the second signal.

According to various embodiments, the at least one output circuit 440 of the electronic device 400 may be characterized by including an audio circuit configured to generate an audio signal as the first signal or a communication circuit configured to generate a communication output signal as the first signal. According to various embodiments, the external connector of the electronic device 400 may be characterized by being connected electrically to an external device, which may be characterized by including at least one of a speaker, a power source, and a lid.

According to various embodiments, the electronic device 400 may be characterized by including an opening formed on one or another side of the housing, a hole connecting to the opening, and a receptacle arranged inside the hole to receive the external connector and connected electrically to the at least one output circuit 440.

According to various embodiments, the electronic device 400 may be characterized by including at least one other sensor 420 arranged close to at least one of the opening and the other receptacle.

According to various embodiments, the electronic device 400 may be characterized by including a housing, at least one output circuit 440 arranged inside the housing and configured to generate a first signal, an opening formed on one side of the housing, a hole connected to the opening to receive an external connector or an external accessory, at least one sensor 420 arranged close to at least one of the opening and the hole, and a control circuit 410 electrically connected to the at least one output circuit 440 and the at least one sensor 420, the control circuit 410 being characterized by being configured to generate a second signal upon detection of an approach of the external connector to at least one of the opening and the hole and to change the first signal to be output at least partly based on the second signal.

Figure 5:
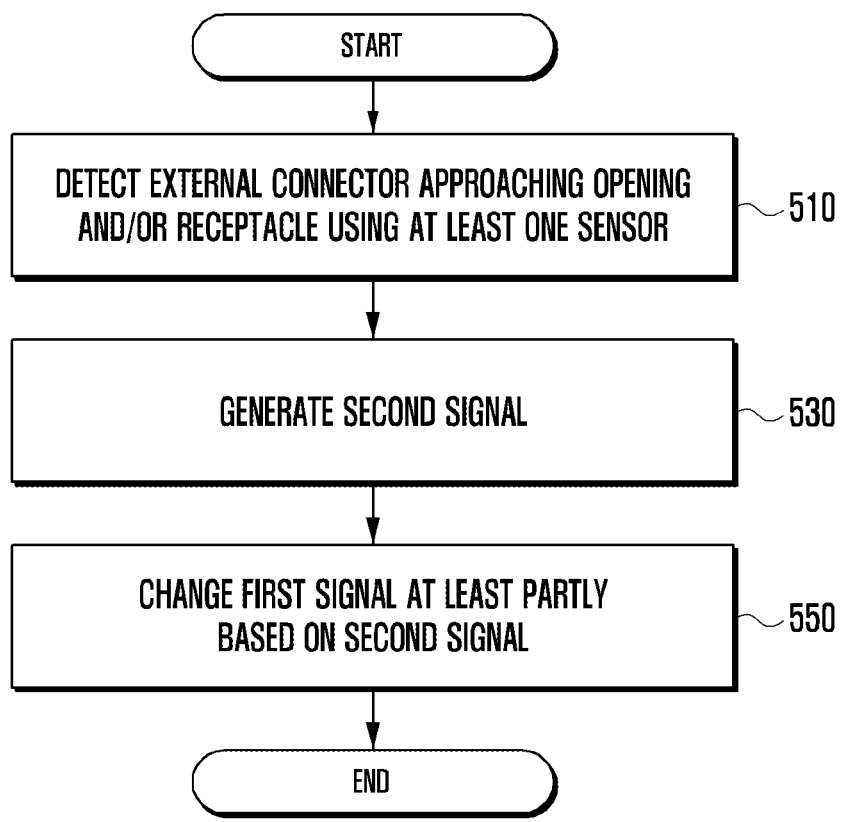
FIG. 5 is a flowchart illustrating an example noise canceling method according to various example embodiments.

FIG. 5 is a flowchart illustrating an example noise canceling method according to various example embodiments.

Referring to FIG. 5, the control circuit 410 may detect an external connector approaching at least one of the opening and receptacle 430 by means of the at least one sensor 420 at step 510.

The sensor 420 may be any of all the types of sensors that are capable of detecting an object contacting or approaching to at least one of the opening or the receptacle 430. For example, the sensor 420 may be one of the gesture sensor 240A, the gyro sensor 240B, the barometric pressure sensor 240C, the magnetic sensor 240D, the acceleration sensor 240E, the grip sensor 240F, the proximity sensor 240G, the color sensor 240H (e.g., Red, Green, Blue (RGB) sensor), the biometric sensor 240I, the temperature/humidity sensor 240J, the light sensor 240K, and the Ultra Violet (UV) sensor 240M.

According to an embodiment, if the sensor 420 includes a capacitance sensor (e.g., grip sensor 240F), a conductive member is arranged inside at least one of the opening and the receptacle 430 to monitor for change of capacitance between the external connector and the conductive member to detect the external connector approaching to at least one of the opening and the receptacle 430.

According to an embodiment, if the sensor 420 includes a proximity sensor (e.g., proximity sensor 240G), it may detect the external connector approaching at least one of the opening and the receptacle 430.

According to various embodiments, the external connector may connect electronically to an external device. Examples of the external device may include an earphone, a headset, a battery charger, an auxiliary memory device, a speaker, a display, a power source, a communication device, and a lid. Examples of the receptacle 430 for receiving an external connector may include an audio input/output receptacle (e.g., earphone receptacle and FireWire receptacle), a video input/output receptacle (e.g., Peripheral Component Interconnect (PCI) receptacle and Digital Visual Interface (DVI) receptacle), a data cable receptacle (e.g., Universal Serial Bus (USB) receptacle), and an optical capable receptacle; examples of the external connector may include a device compatible with the receptacle 430 (e.g., earphone connector, FireWire connector, PCI connector, DVI connector, and USB connector).

According to an embodiment, the control circuit 410 may detect an external connector approaching at least one of the opening or the hole by means of the at least one sensor 420.

The control circuit 410 (e.g., processor 210) may generate a second signal at step 530 upon detection of the external connector approaching the opening or the receptacle 430.

According to various embodiments, in the case of further including at least one conductive member arranged close to at least one of the opening and the receptacle 430, the control circuit 410 may be configured to generate a second signal when the at least one sensor 420 detects change of capacitance between the external connector and the conductive member.

According to various embodiments, the second signal may be transmitted to the output circuit 440. In the case that the output circuit 440 is an audio circuit configured to generate an audio output signal as the first signal, the second signal generated by the control circuit 410 may be transmitted to the audio circuit for control of reducing the strength of the audio output signal or stopping generation of the audio output signal. In the case that the output circuit 440 is a communication circuit configured for generating a communication signal as the first signal, the second signal generated by the control circuit 410 may be transmitted to a communication circuit for control of reducing the strength of the communication output signal or stopping generation of the communication output signal.

According to various embodiments, the control circuit 410 may generate the second signal upon detection of an external connector approaching at least one of the opening or the hole.

The control circuit 410 (e.g., processor 210) may change the first signal to be output at least partly based on the second signal generated by the output circuit 440 at step 550.

According to various embodiments, the output circuit 440 may be configured to reduce the strength of the first signal temporarily in response to the second signal generated by the output circuit 440. In the case that the output circuit 440 is an audio circuit configured to generate an audio output signal as the first signal, it may decrease the strength of the audio output signal. In the case that the output circuit 440 is a communication circuit configured to generate a communication output signal as the first signal, it may decrease the strength of the communication output signal.

According to various embodiments, the strength of the first signal generated by the output circuit 440 is decreased for noise canceling. In the case that the output circuit 440 is an audio circuit susceptible to TDMA noise or popup noise, it may be possible to suppress the noise by reducing the strength of the audio output signal temporarily.

The TDMA noise may occur in the electronic device 400 performing data communication in a TDMA mode. The electronic device 400 operating in the TDMA mode may undergo TDMA noise caused by a voltage drop occurring in the course of transmitting/receiving data, e.g., in a situation that an external connector is coupled with the electronic device 400.

The popup noise may occur from an instant voltage surge generated when the external connector is connected to the electronic device 400, especially when a node of the external connector contacts to a node formed for other purposes inside the receptacle 430.

According to an embodiment, changing the first signal at least partly for canceling the TDMA noise may be performed in such a way of controlling a signal in a frequency band with noise or reducing transmit power during a data transmission period.

According to an embodiment, changing the first signal at least partly for canceling the popup noise may be performed in such a way of cutting off temporarily the electrical connection between the receptacle 430 and the output circuit 440.

According to an embodiment, the electronic device 400 may suppress various types of noise such as TDMA noise and popup noise using the noise canceling circuit 460.

According to various embodiments, the control circuit 410 may check electrical connectivity between the housing and at least one of the components arranged inside the housing in response to the second signal. The reason for checking the electronic connectivity is to protect the internal circuits or components of the electronic device 400 against damage that may occur when an external connector is coupled with the electronic device 400, e.g., when a data cable connector is inserted into a capable receptacle.

According to an embodiment, the control circuit 410 may check electrical connectivity between the housing and at least one of the components arranged inside the housing upon detection of the external connector approaching at least one of the opening and the receptacle 430 to protect the internal circuits and components of the electronic device 400 against damage. According to an embodiment, the control circuit 410 may activate the component damage protection circuit 470 if there is any risk of damage to the electronic components. The component protection circuit 470 may be a current leakage protection circuit for preventing electric current from flowing into an internal circuit or electronic components via the metal housing or an overcurrent protection circuit for protecting against the electronic current equal to or greater than a predetermined level.

The noise canceling method or the damage risk mitigation method are not limited to the above described embodiments, and it is may become apparent to those skilled in the art that various methods can be used to suppress noise and protect the internal circuits and components of the electronic device against damage.

According to an embodiment, the control circuit 410 may generate the second signal to control the output circuit 440 to change the first signal at least partly based on the second signal.

According to various embodiments, the electronic device 400 may include two receptacles 430. For example, the electronic device may further include an additional receptacle arranged inside an additional opening formed on one or another side of the housing and an additional hole connected to the additional opening and configured to receive an external connector, the additional receptacle being connected electrically to the at least one output circuit 440. The electronic device may further include an additional sensor arranged close to at least one of the additional opening and the additional receptacle 430. According to an embodiment, the electronic device 400 may include an additional opening formed on one or another side of the housing and an additional hole connected to the additional opening, and the additional opening may be configured to receive an external connector. Likewise, the electronic device 400 may further include at least one additional sensor arranged close to at least one of the additional opening and the additional hole.

Figure 6:
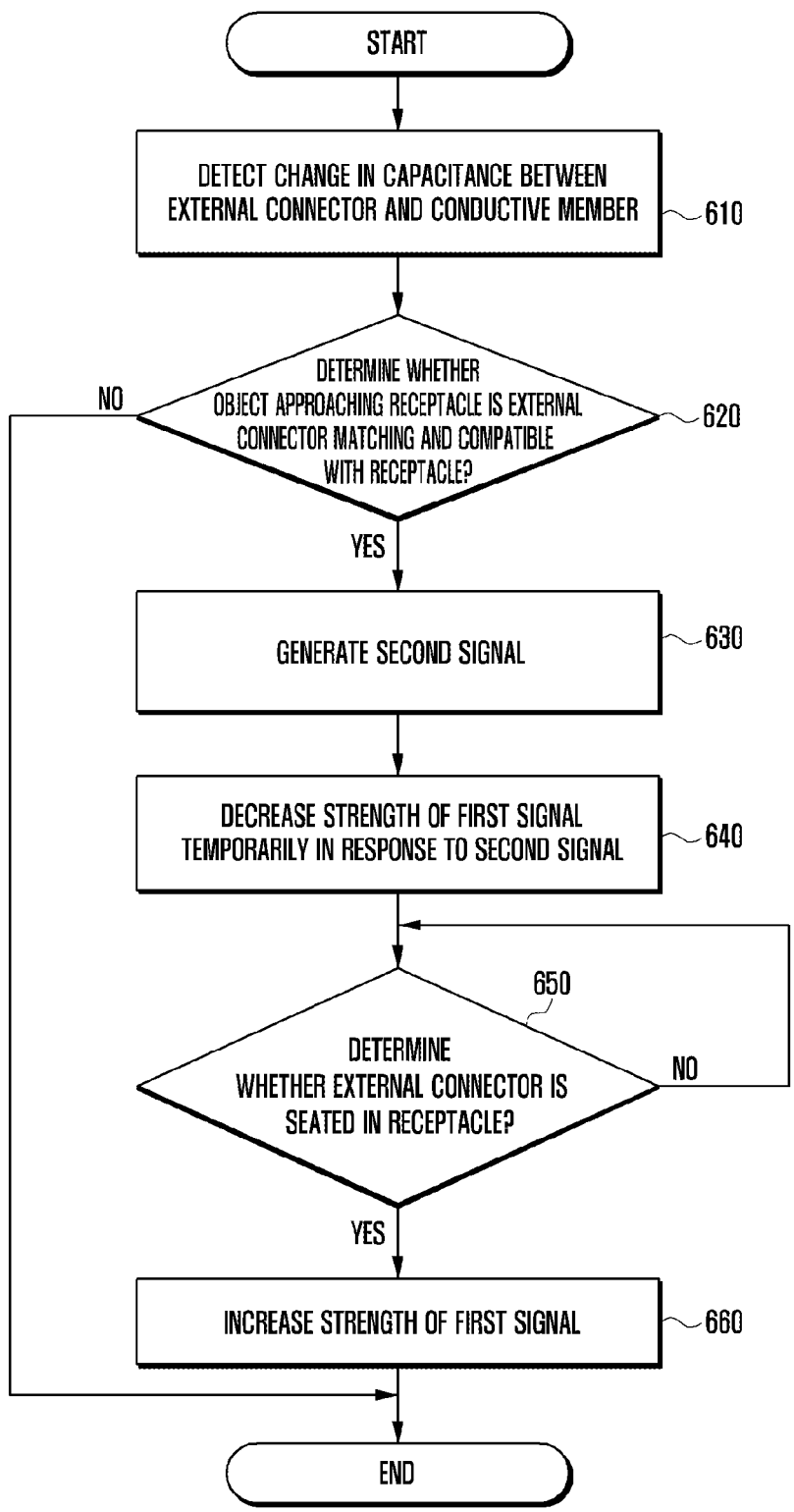
FIG. 6 is a flowchart illustrating an example noise canceling method according to an example embodiment

FIG. 6 is a flowchart illustrating an example noise canceling method according to an embodiment. Although FIG. 6 illustrates an example embodiment to aid in understanding of the disclosure, it should be understood that the disclosure is not limited to the example embodiment of FIG. 6.

Referring to FIG. 6, the electronic device may detect a change in capacitance between the external connector and the conductive member by means of the at least one sensor 420 that is capable of sensing an object approaching the receptacle 430 of the electronic device 400 at step 610.

According to various embodiments, the change of capacitance between the external connector and the conductive member may be sensed by a capacitance sensor. The capacitance sensor may be a device configured to sense a change in capacitance using proximity, displacement, humidity, flow rate, and acceleration based on a capacitance coupling effect. According to an embodiment, the at least one sensor 420 may be a grip sensor for sensing a capacitance change occurring when an external connector is approaching at least one of the opening or the receptacle 430. According to an embodiment, the at least one sensor 420 may be configured to detect a capacitance change occurring as the external connector approaches at least one of the opening and the hole.

According to various embodiments, the electronic device 400 may include at least one conductive member arranged close to at least one of the opening and the receptacle 430 and detect a change in capacitance by means of the sensor 420 that is connected electrically to the conductive member for measuring capacitance between the conductive member and an external connector approaching the conductive member. For example, it may be possible to detect a change in capacitance between the conductive member and an external connector approaching thereto by connecting the sensor 420 to the conductive member and a ground node of a Printed Circuit Board (PCB). According to an embodiment, it may be possible to sense a change in capacitance by connecting electrically at least one conductive member arranged close to at least one of the opening and the hole to the sensor 420.

The reference capacitance before the contact or approach of the external connector may be the capacitance between the sensor 420 and the ground node of the PCB. In the case that an external connector has contacted or approached the conductive member, the measured capacitance may be calculated by adding the capacitance between the contact or approaching point of the external connector and the conductive member to the reference capacitance between the sensor 420 and the ground node of the PCB. That is, the capacitance increases when an external connector contacts or approaches the conductive member, and the capacitance sensor 420 may detect the increase in capacitance.

According to an embodiment, the electronic device 400 may be configured to include at least one conductive member arranged close to at least one of the opening and the hole.

The control circuit 410 may determine whether the object approaching the receptacle 430 is an external connector matching and compatible with the receptacle 430 at step 620.

According to various embodiments, whether the approaching object is an external connector matching and compatible with the receptacle 430 may be determined by judging whether the displacement of capacitance is in a predetermined capacitance displacement range. For example, it may be possible to set a displacement range of capacitance occurring when an external connector is approaching the opening or the receptacle 430 and, if the displacement of capacitance between the opening or the receptacle 430 and the approaching object is in the preset capacitance displacement range, determine that the object is an external connector matching and compatible with the receptacle 430.

According to an embodiment, the control circuit 410 (e.g., processor 210) may check a capacitance displacement between an earphone hole or the receptacle 430 and an external connector seated therein and, if the capacitance displacement is in a predetermined capacitance displacement range, determine that the external connector is an earphone connector. According to an embodiment, the control circuit 410 (e.g., processor 210) may check a capacitance displacement between a data capable hole or the receptacle 430 and an external connector seated therein and, if the capacitance displacement is in a predetermined capacitance displacement range, determine that the external connector is a data capable connector.

The memory 230 may store the information of a predetermined capacitance displacement range allowed for an external connector connectable to the electronic device 400. The capacitance displacement range allowed for the external connector may be determined Table 1 shows the capacitance values measured after arranging the conductive member inside the opening of the electronic device according to an embodiment.

TABLE 1

| | Default value | When connecting member is being inserted | When connecting member has been inserted | When touching by hand |
|---|---|---|---|---|
| Capacitance (Unit: F) | 38.4137 | 38.4979 | 38.5259 | 38.7122 |
| Displacement to default value | 0 | 8826 | 11115 | 31299 |

The measurement result may be determined differently depending on at least one of simulation equipment, an electronic device, an external connector, and a receptacle of the electronic device; and Table 1 shows specific values to aid in understanding of the disclosure.

In reference to the simulation results of Table 1, the electronic devices' own capacitance (default capacitance) is 38.4137 F, the capacitance between the conductive member and the external connector approaching or contacting the opening is 38.4979 F, the capacitance between the conductive member and the external connector seated completely in the receptacle is 38.5259 F, and the capacitance measured when the opening is touched by a hand is 38.7122 F.

By converting displacements of the capacitances measured as shown in Table 1 in association with the default value using the simulation equipment, the displacement of the capacitance between the conductive member and the external connector approaching or contacting the opening is 8826, the displacement of the capacitance between the conductive member and the external connector seated completely in the receptacle is 11115, and the displacement of the capacitance measured when the opening is touched by a hand is 31299.

According to the simulation result of Table 1, the displacement of the capacitance between the receptacle 430 and the external connector seated therein is in the range between 9926 and 11115.

The displacement of the capacitance between the opening or the receptacle 430 and the approaching or contacting external connector may be set as a minimum capacitance displacement, and the displacement of the capacitance between the receptacle 430 and the external connector seated therein may be set as a maximum capacitance displacement. However, the minimum and maximum capacitance displacements may be adjusted to have larger ranges so as to reduce a margin of error. For example, it may be possible to set a capacitance displacement range for determining an object approaching the receptacle 430 as an external connector matching and compatible with the receptacle 430 to the range between 8000 and 12000 according to the simulation result.

According to an embodiment, it may be possible to detect the situation where the user grips the electronic device 400 using the simulation result. For example, it may be possible to set a capacitance value for determining the user's grip of the electronic device. In this case, if a change in capacitance is detected, the control circuit may determine whether the change in capacitance is caused by the user's grip of the electronic device or the approach of an external connector.

According to various embodiments, even when a capacitance displacement for detecting a coupling of an external connector is not set, if a change in capacitance or insertion of an object into the receptacle 430 is detected, the control circuit 410 may determine whether the inserted object is an external connection matching and compatible with the receptacle 430 in such a way of storing the value of change of the capacitance. For example, if it is determined that capacitance is changed because of an external connector seated in the receptacle 430, the control circuit 410 may record the capacitance change value in the memory 230. After that, if the same capacitance change is detected, the control circuit 410 determines that an external connector is being inserted. According to an embodiment, it may be possible to use a range of capacitance change in consideration of a margin of error of the capacitance change value.

According to various embodiments, the electronic device 400 may include two or more receptacles and, in this case, there may be different changes of capacitance for the respective receptacles in which external connector are inserted. For example, the capacitance change caused by insertion of an earphone connector into the corresponding receptacle and the capacitance change caused by insertion of a data cable into the corresponding receptacle may differ from each other. The capacitance change value in the case that an external connector is inserted into the receptacle 430 may be different from the capacitance change value in the case where no external connector is inserted. Accordingly, it may be necessary to store the capacitance change values for all of the cases to determine whether the approaching object is matching and compatible with the receptacle 430.

According to an embodiment, the control circuit 410 may determine whether an approaching object can be inserted into the hole and be compatible with the receptacle 430 based on the detected capacitance change.

If it is determined that the detected object is matching and compatible with the receptacle 430, the control circuit 410 (e.g., processor 210) may generate a second signal at step 630. The second signal may be delivered to the output circuit 440. In the case that the output circuit 440 is an audio circuit configured to generate an audio output signal as the first signal, the second control signal generated by the control circuit 410 may be a signal for controlling the audio circuit to decrease the strength of the audio signal or to stop generating the audio signal temporarily. In the case that the output circuit 440 is a communication circuit configured to generate a communication output signal as the first signal, the second signal generated by the control circuit 410 may be a signal for controlling the communication circuit to decrease the strength of the communication output signal or to stop generating the communication output signal temporarily.

According to an embodiment, the control circuit 410 may generate the second signal when it is determined that the detected object can be inserted into the hole and is compatible with the receptacle 430.

The control circuit 410 (e.g., processor 210) may control the output circuit 440 to change the first signal to be output at least partly based on the second signal at step 640.

According to various embodiments, the output circuit 440 may be configured to decrease the strength of the first signal temporarily in response to the second signal. In the case that the output circuit 440 is an audio circuit configured to generate an audio output signal as the first signal, the audio circuit may decrease the strength of the audio output signal. In the case that the output circuit 440 is a communication circuit configured to generate a communication output signal as the first signal, the communication circuit may decrease the strength of the communication output signal.

According to various embodiments, the control circuit 410 may be configured to check electrical connectivity between the housing and at least one electronic component arranged inside the housing in response to the second signal.

The control circuit 410 (e.g., processor 210) may determine whether the external connector is seated in the receptacle 430 by means of a contact or pin at step 650.

According to various embodiments, the control circuit 410 may check electrical connectivity or a physical connection between the external connector and the connector 430 using the contact or the pin arranged inside the receptacle 430. For example, the control circuit 410 may check the complete insertion of the external connector upon receipt of a signal indicating a pressure higher than a predetermined level or an electrical signal from the contact or the pin arranged on the inner wall of the receptacle 430 during the insertion of the external connector into the receptacle 430. Since it may become apparent to those skilled in the art that detecting the complete insertion of an external connector in the receptacle 430 can be made in various manners, a detailed description thereof is omitted herein.

According to an embodiment, the control circuit 410 may determine whether the external connector is completely seated in the hole by means of the contact or the pin.

If it is determined that the external connector is completely seated in the receptacle 430, the control circuit 410 (processor 210) may increase the strength of the first signal at step 660.

According to an embodiment, the control circuit 410 may increase and recover the strength of the first signal when it is determined that the external connector has been completely seated in or removed from the hole.

According to various embodiments, the noise canceling method of the electronic device may include detecting an external connector approaching the opening or the receptacle 430, generating a second signal upon detection of the external connector, and adjusting a first signal to be output at least partly based on the second signal.

According to various embodiments, detecting the external connector approaching to at least one of the opening and the receptacle 430 may be characterized by detecting change in capacitance between the external connector and a conductive member.

According to various embodiments, changing the first signal at least partly may be characterized by decreasing the strength of the first signal temporarily.

According to various embodiments, the noise canceling method of the electronic device 400 may be characterized by including a determination of whether the external connector is seated in the receptacle.

According to various embodiments, the noise canceling method of the electronic device 400 may be characterized by including an increase and recovery of the strength of the first signal based on the determination result.

According to various embodiments, the noise canceling method of the electronic device 400 may by characterized by including checking electrical connectivity between the housing and at least one electronic component arranged inside the housing based on the second signal.

According to various embodiments, the noise canceling method of the electronic device 400 may be characterized by including a determination, when an approaching object is detected, of whether the approaching object is an external connector matching and compatible with the receptacle 430

Figure 7:
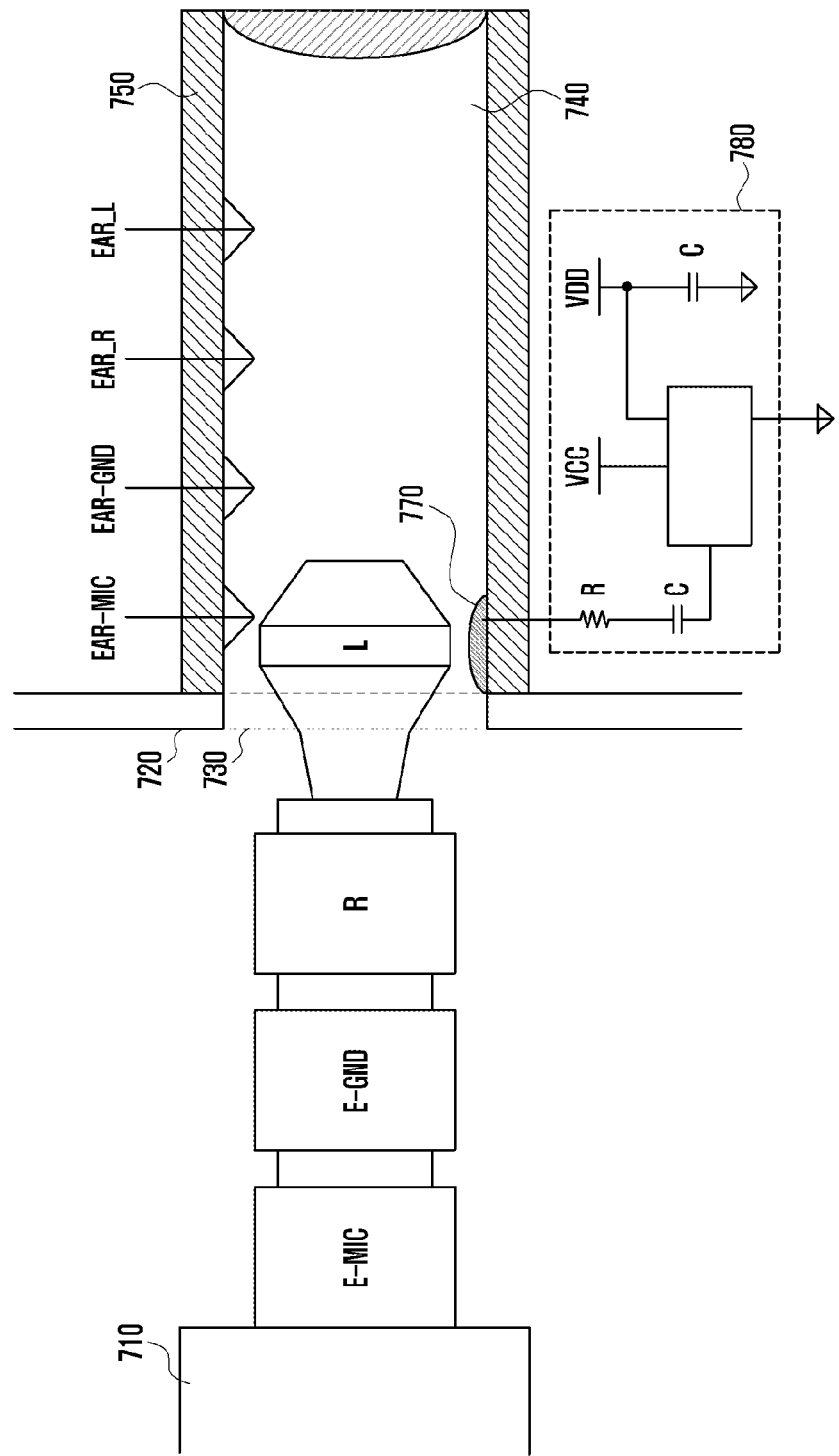
FIG. 7 is a cross-sectional diagram illustrating an example receptacle of an electronic device in the state of receiving an external connector according to an example embodiment.
Figure 8:
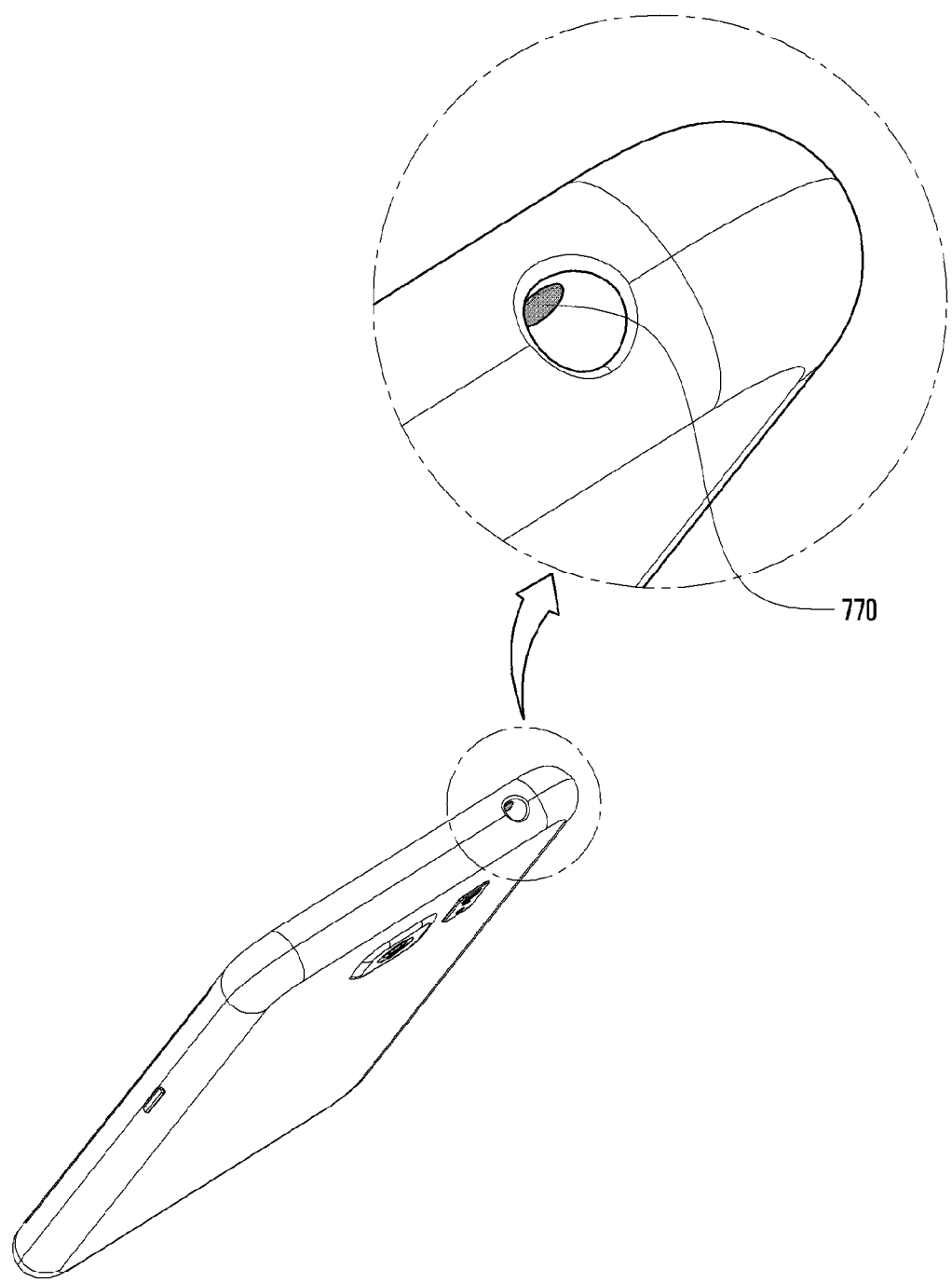
FIG. 8 is a perspective view illustrating an example electronic device with an enlarged external contour of the receptacle of FIG. 7.

FIG. 7 is a cross-sectional view illustrating an example receptacle of an electronic device in the state of receiving an external connector according to an example embodiment. FIG. 8 is a perspective view illustrating an example electronic device with an enlarged external contour of the receptacle of FIG. 7.

Referring to FIGS. 7 and 8, the electronic device 400 may include an opening 730 formed on one side of the housing 720 and a receptacle 750 having a cylindrical hole 740 of which one end is closed and the other is opened to connect to the opening 730 and a conductive member 770 arranged on the inner wall of the receptacle 750 at the opened end close to the opening 730.

The conductive member 770 may be made of a conductive metal such as copper, silver, and aluminum.

If insertion of the external connector 710 into the receptacle 750 starts, a capacitance sensor 780 may receive an electric signal from the conductive member 770. The capacitance sensor 780 may detect change of capacitance and, in this case, the control circuit may determine that the capacitance has changed by the insertion of the external connector 710.

According to various embodiments, it may be possible to determine whether the object inserted into the receptacle is a compatible external connector in such a way of presetting capacitance displacement for judging insertion of a compatible external connector or, if there is no preset capacitance displacement for judging insertion of a compatible external connector, storing a value of capacitance change detected upon receipt of the external connector.

Figure 9:
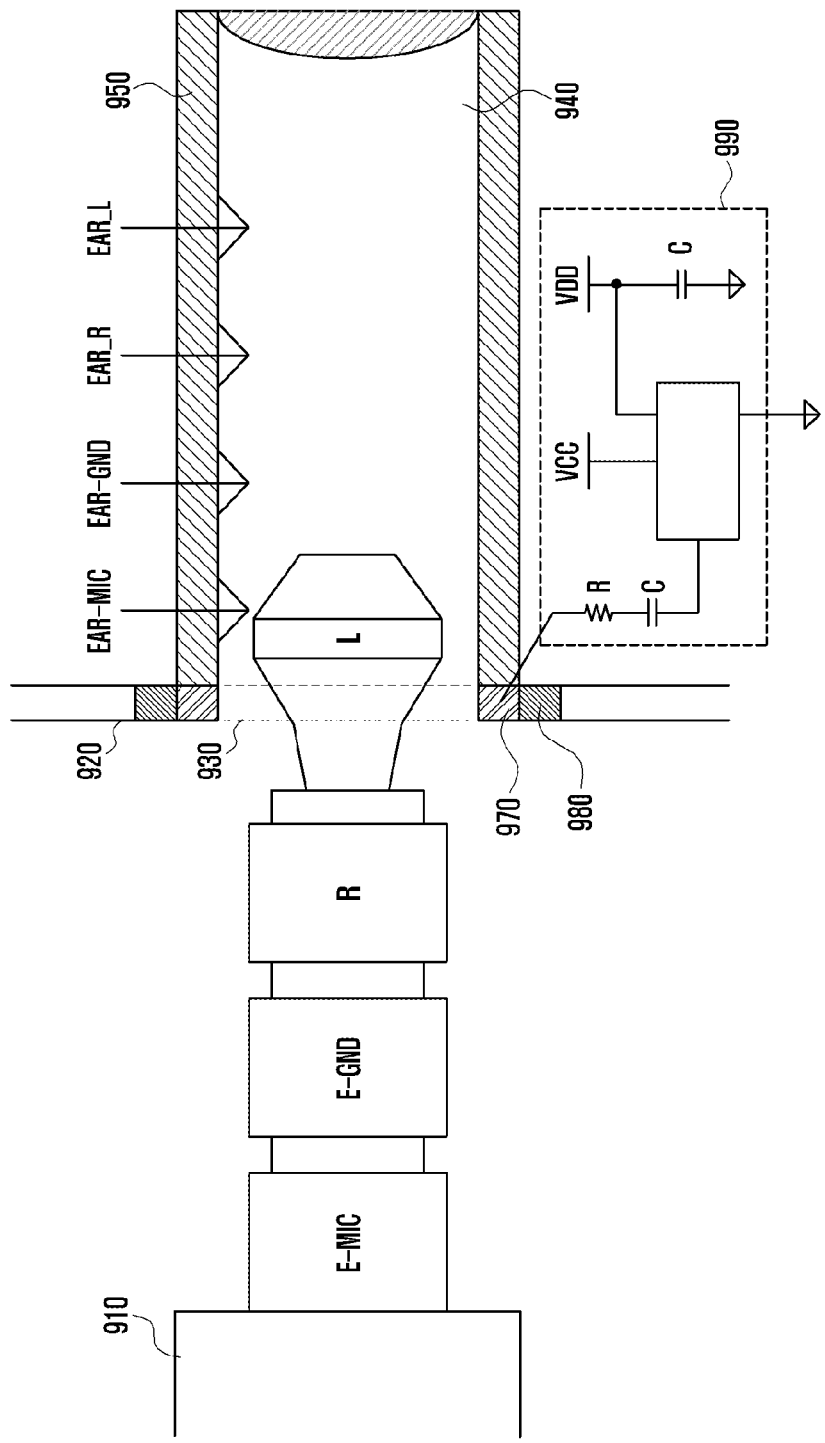
FIG. 9 is a cross-sectional diagram illustrating an example receptacle of an electronic device in the state of receiving an external connector according to another example embodiment.
Figure 10:
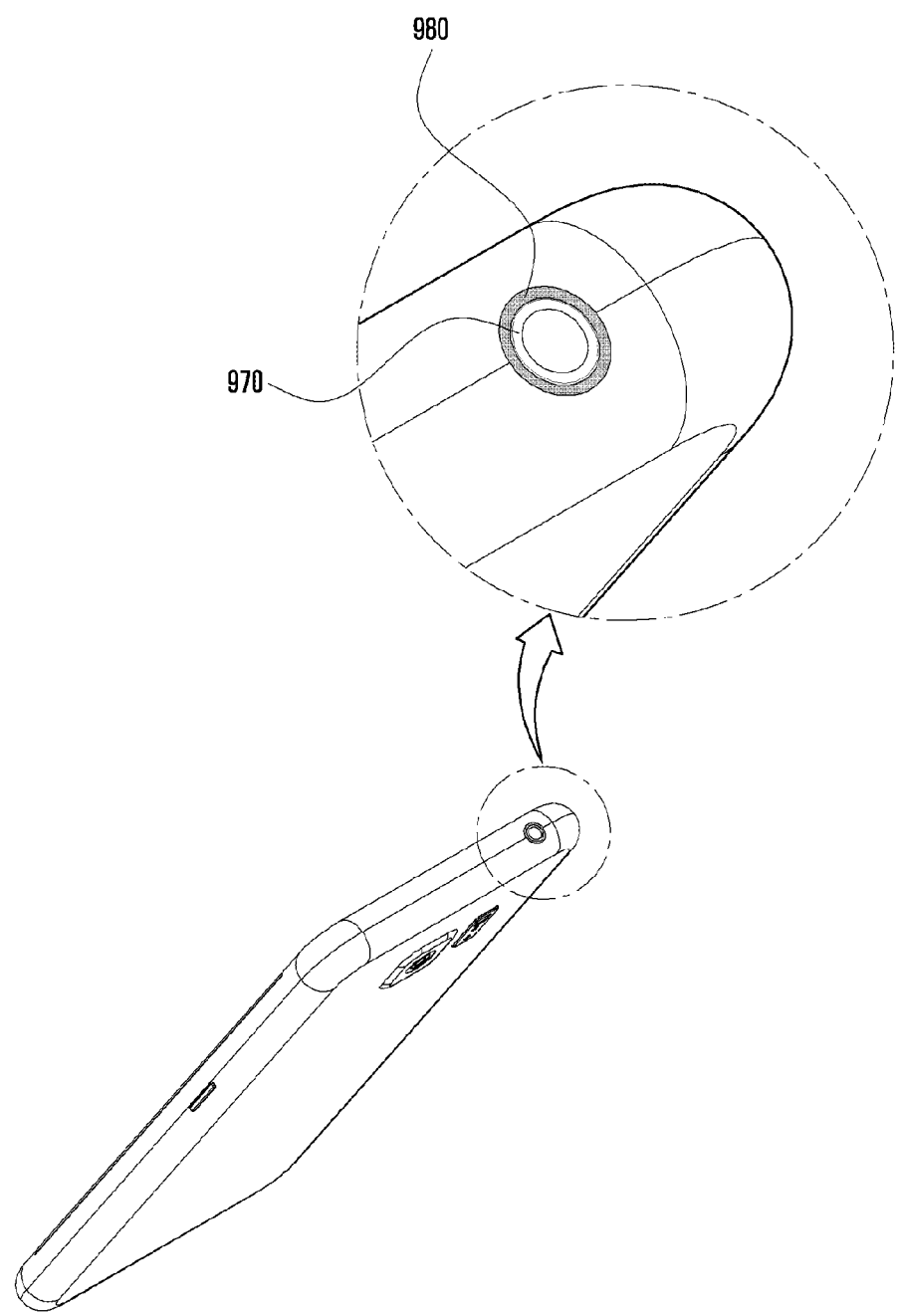
FIGS. 10 and 11 are perspective views illustrating an example electronic device with enlarged external contours of the receptacle of FIG. 9.
Figure 11:
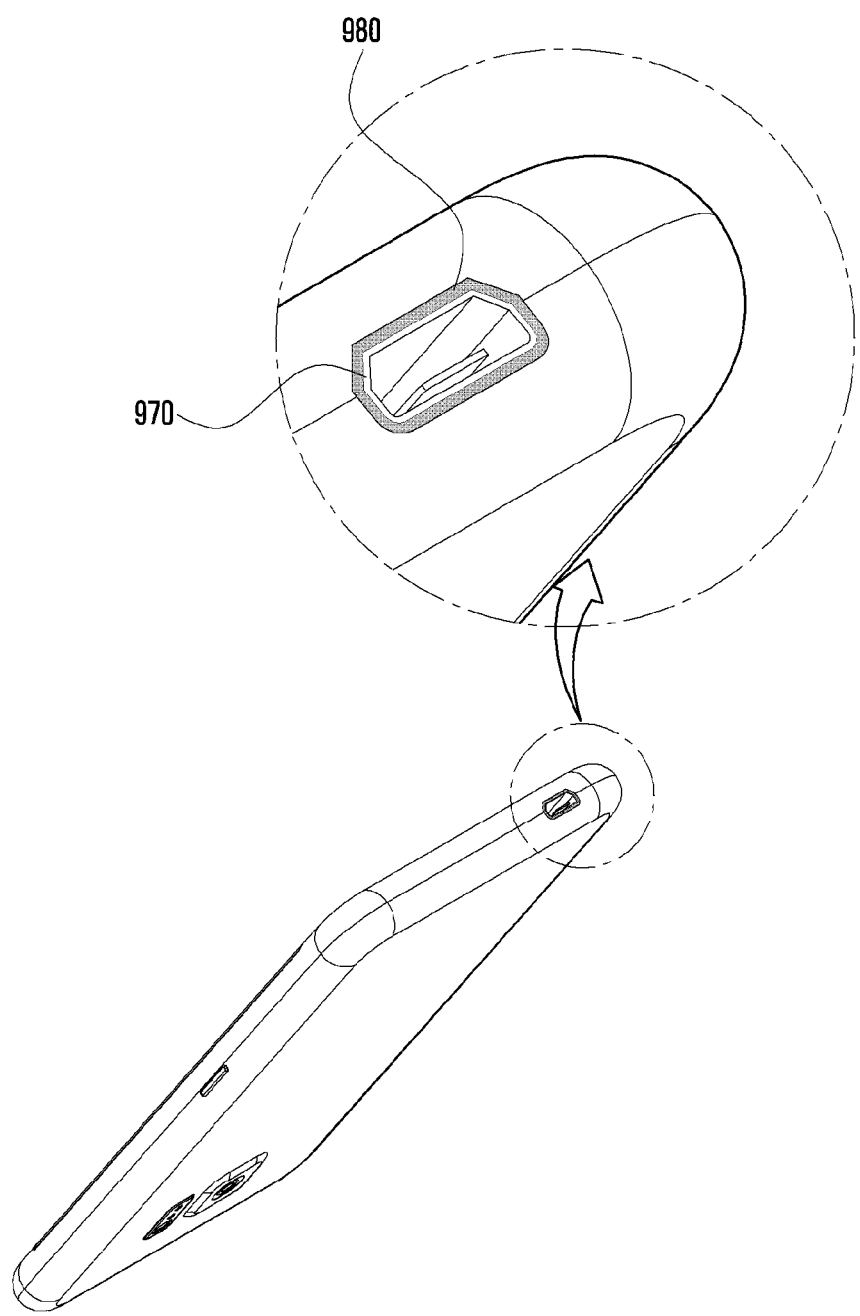

FIG. 9 is a cross-sectional view of a receptacle of an electronic device in the state of receiving an external connector according to another embodiment. FIGS. 10 and 11 are perspective views of an electronic device with enlarged external contours of the receptacle of FIG. 9.

In reference to FIG. 9, the electronic device 400 may include an opening 930 formed on one side of the housing 920 and a receptacle 950 having a cylindrical hole 940 of which one end is closed and the other is opened to connect to the opening 930 and a conductive member 970 abutted to the opened end of the receptacle 950 coaxially.

The conductive member 970 may be made of a conductive metal such as copper, silver, and aluminum.

According to various embodiments, the electronic device 400 may include an insulation member 980 surrounding the conductive member 970 to insulate electrically the housing 920 from the conductive member 970. The insulation member 980 may be made of insulation material such as glass, ebonite, diamond, and rubber. If insertion of the external connector into the receptacle 950 starts, a capacitance sensor 990 may receive an electric signal from the conductive member 970. The capacitance sensor 990 may detect change of capacitance and, in this case, the control circuit may determine that the capacitance has changed by the insertion of the external connector 910.

According to various embodiments, it may be possible to determine whether the object inserted into the receptacle is a compatible external connector in such a way of presetting capacitance displacement for judging insertion of a compatible external connector or, if there is no preset capacitance displacement for judging insertion of a compatible external connector, storing a value of capacitance change detected upon receipt of the external connector. Although an earphone connector is depicted along with a grip sensor in FIGS. 7 to 10 and a data capable connector is depicted along with a grip sensor in FIG. 11, the drawings are to be regarded in an illustrative than a restrictive sense in order to help understand the disclosure. The various embodiments can be applied to all the types of external connector interfaces provided by the electronic device 400. The electronic device and noise canceling method according to various embodiments is capable of protecting internal components of the electronic device against damage by allowing the electronic device equipped with various types of connector interfaces to detect corresponding connectors such as a FireWire connector, a PCI connector, a DVI connector, and a USB connector and to suppress noise occurring when an external connector is coupled with the electronic device.

As described above, the noise canceling method and apparatus of an electronic device is advantageous in terms of improving connection stability between two electronic devices by canceling noise occurring in the course of inserting an external connector into a receptacle of the electronic device.

Also, the noise canceling method and apparatus of an electronic device is advantageous in terms of protecting the internal circuit or electronic components of the electronic device against damage caused by electric current occurring in the course of inserting an external connector into a receptacle of the electronic device.

The embodiments of the present disclosure are merely provided to assist in a comprehensive understanding of the disclosure and not suggestive of limitation. Therefore, it should be understood that many variations and modifications of the disclosure herein described will still fall within the spirit and scope of the embodiments as defined in the appended claims.

What is claimed is:
1. An electronic device comprising:
a housing;
at least one output circuit arranged inside the housing and configured to generate a first signal;
an opening formed on one side of the housing;
a hole connected to the opening;
a receptacle arranged inside the hole, the receptacle being configured to receive an external connector, and electrically connected to the at least one output circuit;
at least one sensor arranged within a predetermined proximity range of at least one of the opening and the receptacle; and
a control circuit electrically connected to the at least one output circuit, the receptacle, and the at least one sensor,
wherein the control circuit is configured to:
control the at least one output circuit to output the first signal,
detect the external connector approaching at least one of the opening and the receptacle using the at least one sensor, generate a second signal upon detection of the approaching external connector, and control the at least one output circuit to change the first signal at least partly based on the second signal, and wherein the changing of the first signal comprises temporarily decreasing a strength of the first signal in response to the second signal.

2. The electronic device of claim 1, further comprising at least one conductive member arranged within a predetermined proximity range of at least one of the opening and the receptacle.

3. The electronic device of claim 1, wherein the control circuit is configured to generate the second signal when the at least one sensor detects a change in capacitance between the conductive member and the external connector.

4. The electronic device of claim 1, further comprising a contact or a pin arranged inside the receptacle.

5. The electronic device of claim 4, wherein the control circuit is configured to determine whether the external connector is seated in the receptacle based on a signal received when the external connector contacts the contact or the pin.

6. The electronic device of claim 5, wherein the control circuit is configured to increase the decreased strength of the first signal when the external connector is seated in the receptacle.

7. The electronic device of claim 1, wherein the control circuit is configured to check electrical connectivity between the housing and at least one electronic component arranged in the housing in response to the second signal.

8. The electronic device of claim 1, wherein the at least one output circuit is one of an audio circuit configured to generate an audio output signal as the first signal or a communication circuit configured to generate a communication output signal as the first signal.

9. The electronic device of claim 1, wherein the external connector is electrically connected to an external device, the external device comprising at least one of a speaker, a power source, and a lid.

10. The electronic device of claim 1, further comprising:
a secondary opening formed on one of the same side as the opening or another side;
a secondary hole connected to the secondary opening; and
a secondary receptacle arranged inside the secondary hole, configured to receive a secondary external connector, and electrically connected to the at least one output circuit.

11. The electronic device of claim 10, further comprising at least one secondary sensor arranged within a predetermined proximity range to at least one of the secondary opening and the secondary receptacle.

12. An electronic device comprising:
a housing;
at least one output circuit arranged inside the housing and configured to generate a first signal;
an opening formed on one side the housing;
a hole connected to the opening and configured to receive an external connector or an external accessory;
at least one sensor arranged within a predetermined proximity range to at least one of the opening and the hole; and
a control circuit electrically connected to the at least one output circuit and the at least one sensor,
wherein the control circuit is configured to:
control the at least one output circuit to output the first signal,
detect the external connector approaching at least one of the opening and the hole using the at least one sensor,
generate a second signal upon detection of the approaching external connector, and
control the output circuit to change the first signal at least partly based on the second signal, and
wherein the changing of the first signal comprises temporarily decreasing a strength of the first signal in response to the second signal.

13. A noise canceling method of an electronic device, the method comprising:
outputting a first signal;
detecting an external connector approaching at least one of an opening and a receptacle of the electronic device;
generating a second signal upon detection of the approaching external connector; and
changing the first signal at least partly based on the second signal,
wherein the changing of the first signal comprises temporarily decreasing a strength of the first signal in response to the second signal.

14. The method of claim 13, wherein detecting the external connector comprises determining a change in capacitance between the external connector and a conductive member.

15. The method of claim 13, further comprising determining whether the external connector is completely seated in the receptacle.

16. The method of claim 15, further comprising increasing the decreased strength of the first signal if it is determined that the external connector is completely seated in the receptacle.

17. The method of claim 13, further comprising determining electrical connectivity between a housing of the electronic device and at least one component arranged inside the housing based on the second signal.

18. The method of claim 13, further comprising determining whether the approaching external connector is matching and compatible with the receptacle.

* * * * *